US012095451B2

(12) United States Patent
Song et al.

(10) Patent No.: US 12,095,451 B2
(45) Date of Patent: Sep. 17, 2024

(54) GATE DRIVER

(71) Applicant: SEMICONDUCTOR COMPONENTS INDUSTRIES, LLC, Phoenix, AZ (US)

(72) Inventors: Kinam Song, Gilbert, AZ (US); Michal Kuban, Valasske Mezirici (CZ); Vlad Anghel, Bucharest (RO); Guy Rahamim, Chandler, AZ (US); John Constantino, Morgan Hill, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 73 days.

(21) Appl. No.: 17/653,730

(22) Filed: Mar. 7, 2022

(65) Prior Publication Data

US 2023/0111154 A1    Apr. 13, 2023

Related U.S. Application Data

(60) Provisional application No. 63/262,264, filed on Oct. 8, 2021.

(51) Int. Cl.
*H02H 3/06* (2006.01)
*H02H 3/08* (2006.01)
*H03K 17/0812* (2006.01)

(52) U.S. Cl.
CPC ......... *H03K 17/08122* (2013.01); *H02H 3/06* (2013.01); *H02H 3/08* (2013.01); *H03K 17/08128* (2013.01)

(58) Field of Classification Search
CPC ....... H03K 17/08122; H03K 17/08128; H02H 3/06; H02H 3/08

(Continued)

(56) References Cited

U.S. PATENT DOCUMENTS

2004/0120090 A1* 6/2004 Galli ................... H02M 3/3376
361/115
2010/0253268 A1* 10/2010 Marvelly ................ H02P 27/08
318/400.26

(Continued)

FOREIGN PATENT DOCUMENTS

EP    2985911 A1    2/2016

OTHER PUBLICATIONS

Texas Instruments, "UCC21732-Q1 10-A Source/Sink Reinforced Isolated Single Channel Gate Driver for SiC/IGBT with Active Protection, Isolated Analog Sensing and High-CMTI," SLUSDH7B, Feb. 2019, Revised Sep. 2019.

(Continued)

*Primary Examiner* — Jared Fureman
*Assistant Examiner* — Lucy M Thomas
(74) *Attorney, Agent, or Firm* — Brake Hughes Bellermann LLP

(57) ABSTRACT

A gate driver to control a high-power switching device is disclosed. The gate driver includes a multifunction pin that allows the gate driver to be controlled by a multifunction signal to perform a number of different functions. For example, a level of the multifunction signal at the multifunction pin can enable/disable the output of the gate driver. In another example, a level of the multifunction signal that is held for a period while the gate driver is in a fault state can reset the state of the gate driver. In another example, pulsing the multifunction signal a number of times can activate a test of the fault detection capabilities of the gate driver. Utilizing one pin for this control, simplifies circuit complexity for communication between a controller and the gate driver, thereby reducing cost and increasing reliability.

18 Claims, 11 Drawing Sheets

(58) Field of Classification Search
USPC .......................................................... 361/93.4
See application file for complete search history.

(56) References Cited

U.S. PATENT DOCUMENTS

| | | |
|---|---|---|
| 2015/0381152 A1 | 12/2015 | Choi et al. |
| 2016/0025800 A1 | 1/2016 | Sicard |
| 2016/0282407 A1* | 9/2016 | Bacigalupo ........ G01R 31/2621 |
| 2021/0313980 A1* | 10/2021 | Zhou ..................... H03K 17/06 |

OTHER PUBLICATIONS

Extended Search Report for counterpart EP Application No. 22195506.5, mailed Mar. 1, 2023.

* cited by examiner

GATE DRIVER

CROSS-REFERENCE TO RELATED APPLICATION

This application claims the benefit of U.S. Provisional Application No. 63/262,264, filed on Oct. 8, 2021, which is hereby incorporated by reference in its entirety.

FIELD OF THE DISCLOSURE

The present disclosure relates to power integrated circuits and more specifically to a gate driver configured to switch and monitor a high-power switching device.

BACKGROUND

A gate driver is an integrated circuit configured to convert a low power switching signal, such as from a microcontroller, into a high current signal suitable for driving a high-power switching device, such as a power metal oxide semiconductor field effect transistor (MOSFET) or an insulated gate bipolar transistor (IGBT). In other words, the gate driver can be an interface between a low-power domain and a high-power domain and may include electrical isolation to separate the power domains. It is often necessary to monitor the condition of the high-power switching device for safety and reliability. For example, an overcurrent condition can cause damage to the switching device and/or to its coupled devices (e.g., capacitors). Further, the over current condition could result in a safety concern to a user because of the high-power levels of an over current. Accordingly, the gate driver may be further configured to sense conditions of the high-power switching device and report these conditions to the microcontroller. As a result, the gate driver may be configured to communicate with the microcontroller.

SUMMARY

In another aspect, the present disclosure generally describes a high-power switching system that includes a switching device, a gate driver, and a controller. The controller is configured to transmit an input signal to an input pin (IN) of the gate driver to control operation of the switching device. The controller is further configured to receive a fault signal at a fault pin (FLTb) of the gate driver to monitor a fault in the switching device. The controller is further configured to transmit a multifunction signal to a multifunction pin (MFP) of the gate driver to control operation of the gate driver. The gate driver is configured by the multifunction signal to disable an output of the gate driver, activate a fault test to test a fault detector circuit of the gate driver and clear a fault detected by the fault detector circuit of the gate driver.

In at least one aspect, the present disclosure generally describes a gate driver that includes a driver circuit, a fault detector circuit, a fault communication circuit, and a multifunction pin (MFP). The driver circuit is configured to receive an input signal at an input pin (IN) of the gate driver and to transmit an output signal to a switching device coupled at a gate terminal to an output pin (OUT) of the gate driver. The fault detector circuit is configured to receive a desaturation signal at a DESAT pin (DESAT) of the gate driver (or to receive a current sense signal at a current-sense (CS) pin of the gate driver) in order to detect a fault in the switching device. The fault communication circuit is coupled to the fault detector circuit and is configured to (i) set a fault signal when a fault is detected and (ii) transmit the fault signal to a fault pin (FLTb) of the gate driver. The multifunction pin (MFP) of the gate driver is configured to receive a multifunction signal, which can configure the gate driver to (i) enable/disable the driver circuit, (ii) activate a test of the fault detector circuit, and (iii) reset the fault communication circuit.

In another aspect, the present disclosure generally describes a method for testing a fault detector circuit of a gate driver. The method includes (i) receiving a multifunction signal at a multifunction pin of the gate driver, (ii) detecting pulses in the multifunction signal, and (iii) determining that the pulses satisfy a first criterion. Upon satisfying the first criterion the method includes configuring the gate driver to charge an external capacitor, which increases a DESAT signal received at a DESAT pin of the gate driver. Then the method further includes determining that the DESAT signal satisfies a second criterion and holding a fault signal on a fault pin of the gate driver. The method further includes (i) detecting a level change in the multifunction signal, (ii) determining that the level change satisfies a third criterion and (iii) resetting the fault signal on the fault pin.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

The present disclosure describes a gate driver that includes circuitry and protocols necessary for communicating with a microcontroller (i.e., controller) regarding functions other than switching (i.e., auxiliary functions). These auxiliary functions can include functions related to sensing and responding to a fault condition and may include (i) disabling an output of the driver (e.g., in response to a sensed fault condition), (ii) resetting a state of a fault detector (e.g., after a fault condition has ended), and (iii) testing a fault detector (e.g., to ensure it is operable). The disclosed circuits and methods may advantageously simplify the complexity of the communication with the microcontroller by combining these functions at a single input/output pin of the gate driver. In other words, the disclosed gate driver includes a multi-function pin.

Figure 1A:
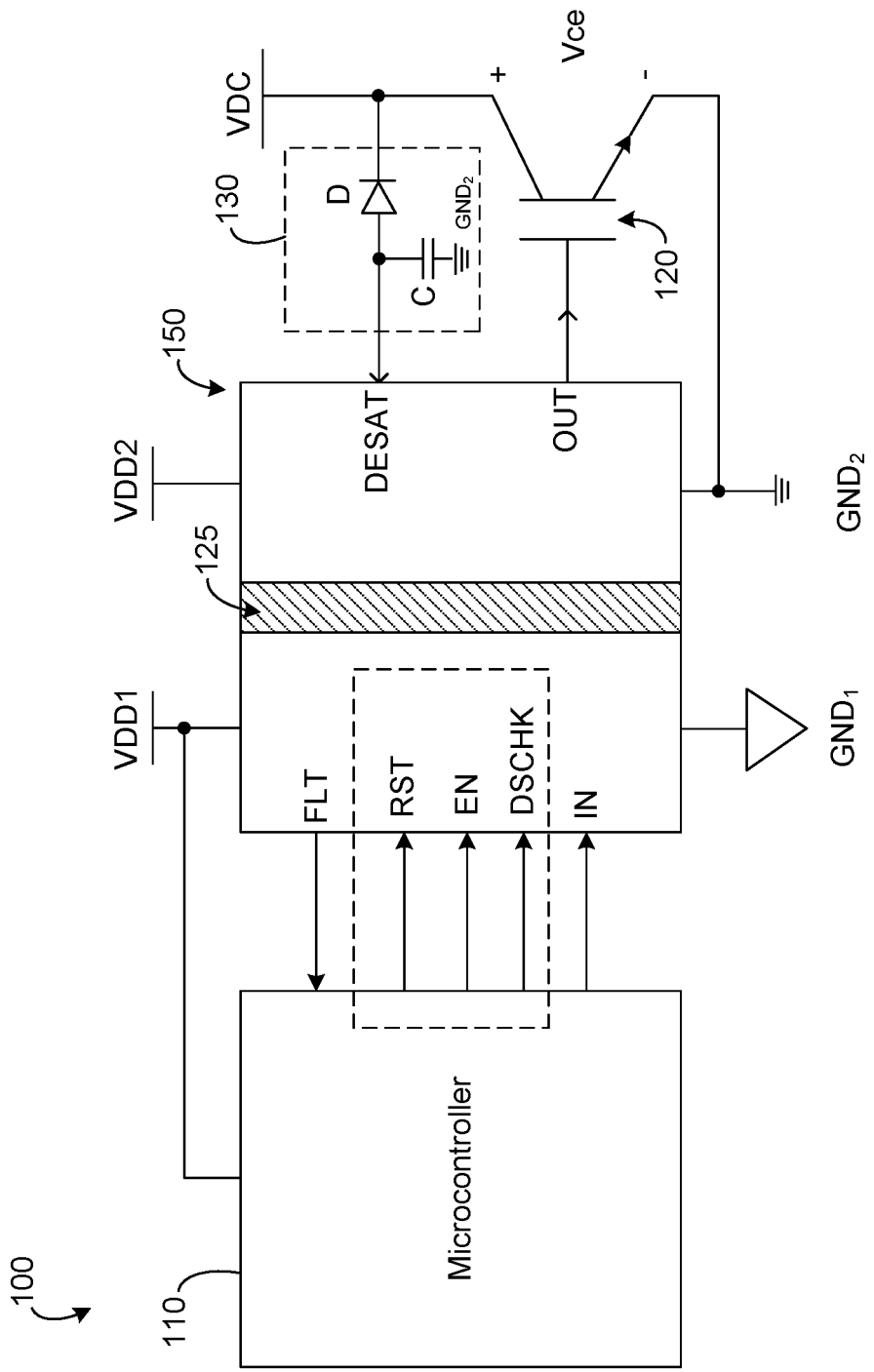
FIG. 1A is a schematic block diagram of a high-power switching system including a gate driver according to a first possible implementation of the present disclosure.

FIG. 1A is a schematic block diagram of a high-power switching system including a gate driver according to a first possible implementation of the present disclosure. The system 100 includes a controller (e.g., microcontroller 110) that controls a switching device 120 via a gate driver 150. The gate driver 150 is coupled at an output to a controlling terminal (e.g., gate terminal) of the switching device 120. The switching device can be any high-power switching device, including (but not limited to) a power MOSFET or an IGBT. The gate driver 150 is configured to provide an output signal (OUT) to change the switch condition (i.e., ON, OFF) of the switching device 120 according to an input signal (IN) from the microcontroller 110. For example, the input signal may be a pulse width modulation (PWM) signal that can turn the switching device ON and OFF according to the modulation, such as in a switching power converter. For example, the switching device may have a high-side (HS) or a low-side (LS) switch included in a synchronous buck (or boost) converter. Further, the gate driver may control a plurality of switching devices, such as in a multiphase (i.e., multichannel) switching power supply. In these implementations it may be necessary to enable/disable the output of the gate driver. For example, in a light load condition a phase including the switching device 120 may be disabled to conserve power. Accordingly, the gate driver may receive an enable signal (EN) from the microcontroller 110 to enable (or disable) its output.

The input signal (IN) to the gate driver 150 may be in a low power domain that spans from a low-power, lower-rail voltage (e.g., low-power ground (GND1) to a low-power, upper-rail voltage (i.e., VDD1), while the output signal (OUT) from the gate driver 150 may be in a high-power domain that spans from a high-power lower rail voltage (e.g., high power ground (GND2) to a high-power, upper-rail voltage (i.e., VDD2).

In some implementations, crosstalk from the high-power domain to the low-power domains can impair function or cause damage to the low power circuitry. According, for these implementations the gate driver may include electrical isolation 125 between a high-power side and a low-power side. The electrical isolation may be implemented with a transformer or capacitor. The present disclosure can be applied to gate drivers with, or without, the electrical isolation 125.

Figure 2A:
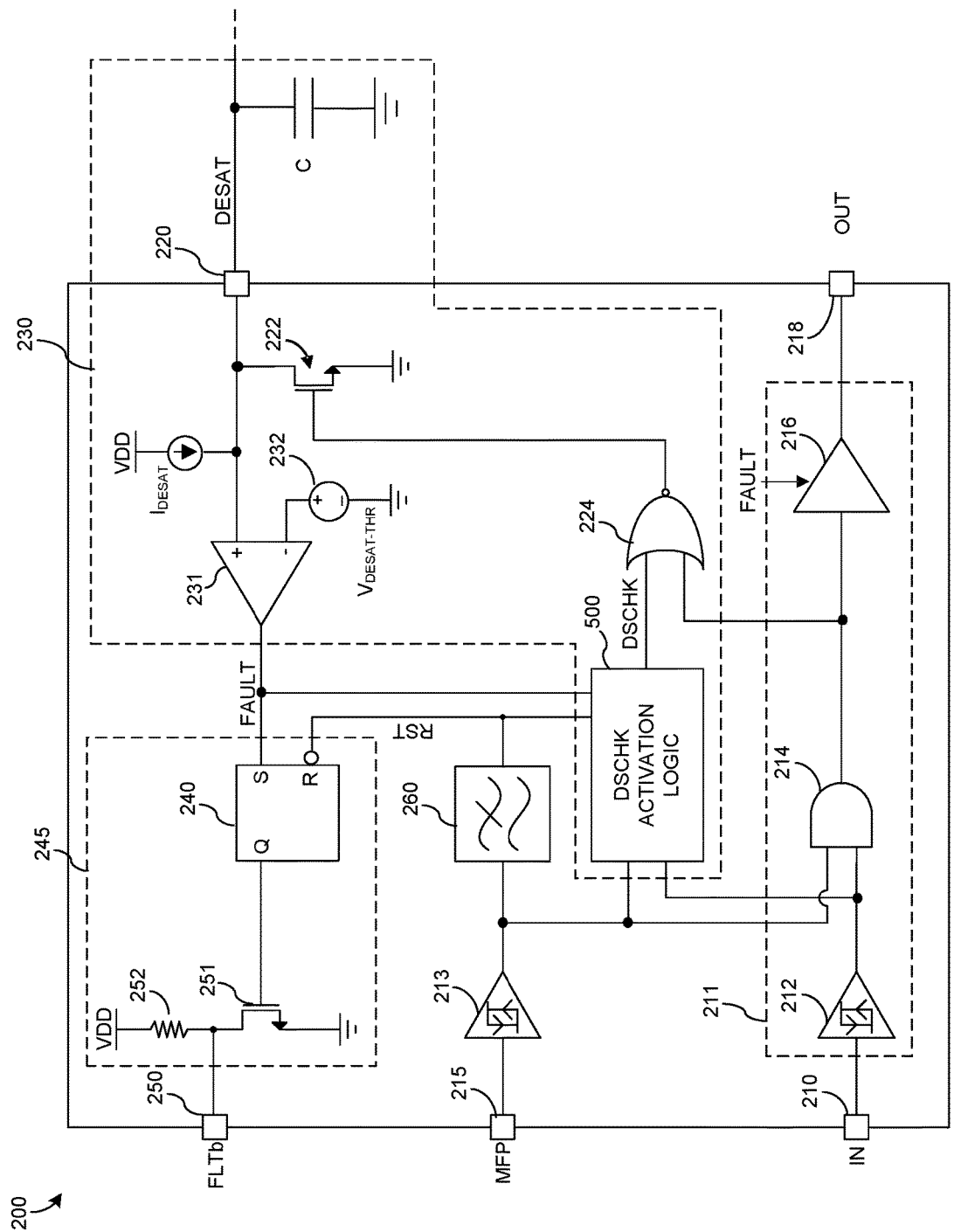
FIG. 2A is a schematic block diagram of a gate driver according to a first possible implementation of the present disclosure.

As mentioned, the gate driver 150 may be configured to perform functions that are auxiliary to its primary function of switching. For example, the gate driver may be configured with a fault protection function. A fault can be an over current condition created by a low impedance (e.g., short circuit) in the switching device. Alternatively, the over current condition may be created by a load coupled to the switching device. For example, a high current drawn by the load (e.g., when the load is shorted) may create the over current condition. Fault (i.e., over current) protection can be implemented in a variety of ways. FIG. 1A illustrates a possible implementation of a gate driver configured to determine over current by a desaturation of the switching device. FIG. 2A illustrates a possible implementation of a gate driver configured to determine over current based on a current sensed in a sense resistor coupled to the switching device.

FIG. 1A illustrates overcurrent protection implemented by sensing desaturation of the switching device 120. Sensing desaturation can include measuring a collector-emitter voltage ($V_{CE}$) of the switching device (e.g., IGBT) using a detection circuit 130. The detection circuit 130 can include a diode (D) so that the measurement of $V_{CE}$ occurs when the switching device 120 is in the ON condition. The detection circuit 130 can further include a capacitor (C) that is charged to $V_{CE}$ while the switching device is in the ON condition. A time constant of the capacitor charging may help to filter changes to $V_{CE}$ during normal switching.

The switching device operates as an ON/OFF switch to conduct/block current to a load when it is in saturation mode. The saturation mode may depend on a collector-emitter voltage of the switching device. For example, a collector-emitter voltage ($V_{CE}$) can be a few volts (e.g., 1 $V_{CE} \leq 4$) when the IGBT is in saturation mode. When the load is short-circuited, the current conducted by the IGBT increase thereby increasing the collector-emitter voltage ($V_{CE}$) pushing the IGBT out of saturation mode. In other words, a high collector-emitter voltage ($V_{CE}$) may indicate that the IGBT has become desaturated and is conducting a high current. The voltage on the capacitor (C) of the detection circuit 130 can be referred to as the desaturation signal (i.e., DESAT). The desaturation signal (DESAT) can be compared to a threshold (e.g., $7 \leq V_{DESAT\_THR} \leq 9$) and when the threshold is exceeded then the controller may change the state of a fault signal (i.e., FLT) transmitted to the microcontroller 110. In response, the microcontroller 110 may change the state of the enable signal (EN) transmitted to the gate driver 150. Switching operation is not resumed until a reset signal (i.e., RST) is received at the gate driver 150. The reset signal (RST) may reset the fault signal (FLT) state back to no-fault. The reset signal (RST) may further re-engage the detection circuit to monitor the desaturation signal.

Figure 1B:
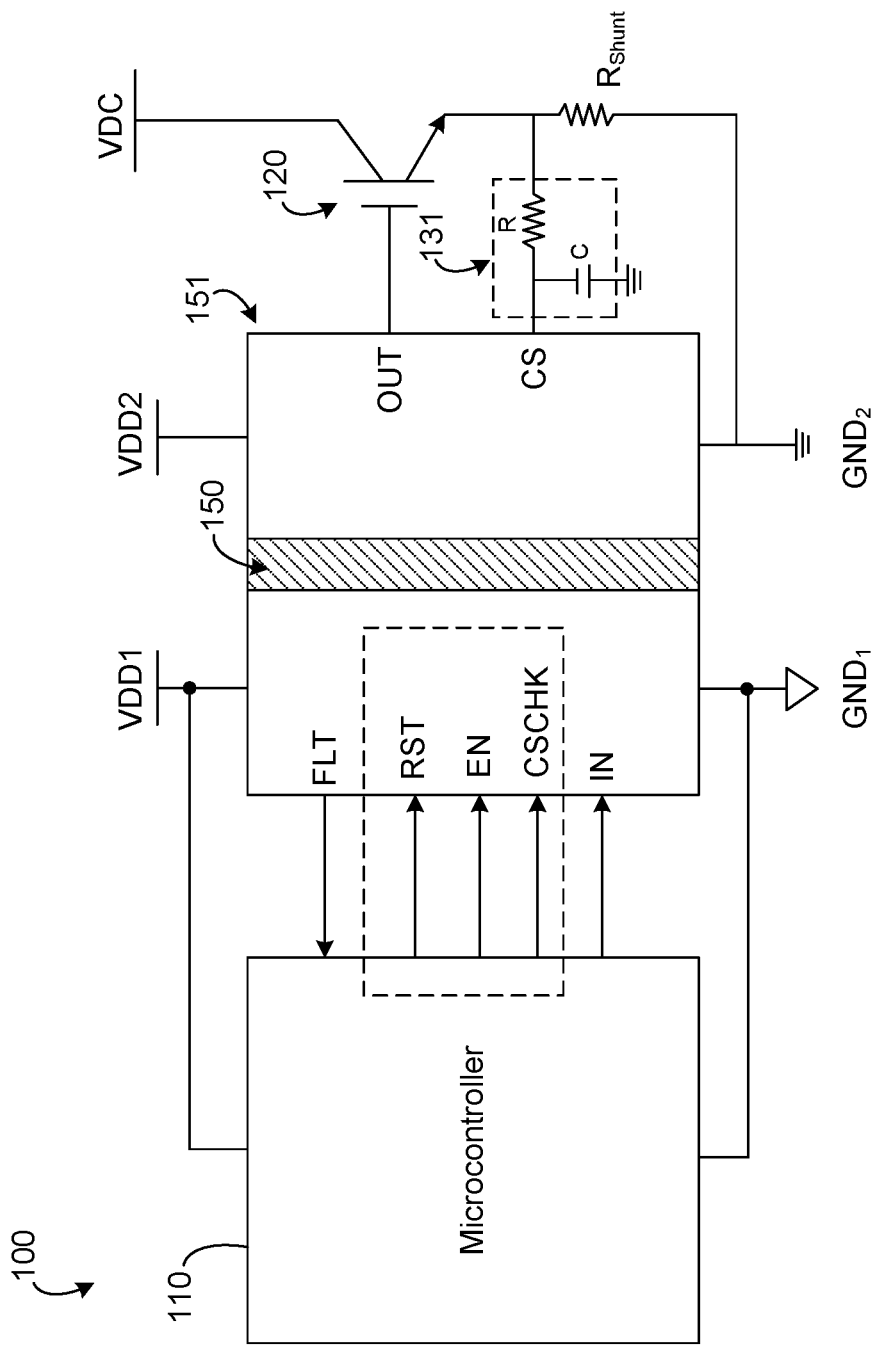
FIG. 1B is a schematic block diagram of a high-power switching system including a gate driver according to a second possible implementation of the present disclosure.

FIG. 1B is a schematic block diagram of a high-power switching system including a gate driver according to a second possible implementation of the present disclosure in which current sensing is used for overcurrent protection. In this implementation, a sense resistor ($R_{SHUNT}$) is coupled in series (e.g., between an emitter terminal and a ground) with a switching device 120 to sense the current flowing through the switching device as a current sense (CS) signal (i.e., voltage). In a possible implementation a filter 131 (e.g., low-pass filter) is coupled between the sense resistor ($R_{SHUNT}$) and the gate driver 151.

Some applications (e.g., automotive) require checking the capability of the gate driver's over current protection (i.e., fault monitoring) periodically. For the implementation shown in FIG. 1A, the microcontroller may transmit a desaturation-check signal (DSCHK) to the gate driver 150. The desaturation-check signal can mimic a fault condition in the circuitry of the gate driver so that the gate driver transmits a fault signal (FLT) indicating a fault. Accordingly, the microcontroller may transmit a DSCHK signal and monitor the FLT signal to see if the fault monitoring circuitry is working properly. For the implementation shown in FIG. 1B, the microcontroller may transmit a current-sense-check signal (CSCHK) to the gate driver 151. The CS-check signal can mimic a fault condition in the circuitry of the gate driver so that the gate driver transmits a fault signal (FLT) indicating a fault. Accordingly, the microcontroller may transmit a CSCHK signal and monitor the FLT signal to see if the fault monitoring circuitry is working properly.

The high-power switching systems shown in FIG. 1A and FIG. 1B illustrate the auxiliary signals (FLT, RST, EN, (DSHK or CSCHK)) communicated between the microcontroller 110 and the gate driver 150. These signals may be binary signals that are either in a HIGH state (e.g., approximately VDD1) or a LOW state (e.g., approximately GND1) to indicate a condition of the signal. A condition may exist for a HIGH signal and may not exist for a LOW signal or vice versa. Accordingly, inverse signals may be defined as well. For example, a fault-bar signal (FLTb) may be the logical inverse of the FLT signal, and a reset-bar signal (RSTb) may be the logical inverse of the RST signal. The microcontroller 110 may be configured to interpret signals or their inverse counterparts.

The gate drivers of FIGS. 1A, 1B may include a pin (i.e., channel) to communicate each auxiliary signal, but it may be advantageous from a size, cost, and complexity standpoint to minimize the number of pins (i.e., channels) necessary for communicating the auxiliary signals. Accordingly, the present disclosure describes a gate driver configured to effectively combine the reset (RST), enable (EN), and fault check signals (i.e., DSCHK, CSCHK) into a single multifunction signal (MFP). By combining the signals, only one pin (i.e., multi-function pin) is used (e.g., is necessary) for receiving these signals from the microcontroller, thereby reducing the cost and complexity of the gate driver.

The present disclosure describes a multifunction signal that is switched between a HIGH level and a LOW level (i.e., modulated) in order to (i) enable/disable the gate driver, (ii) reset a fault condition in the gate driver, and (iii) activate a fault test (i.e., DESAT test, CS test). Accordingly, the present disclosure further describes a gate driver that includes circuitry (e.g., logic) configured to interpret the auxiliary signals from the multifunction signal (MFP). For example, the gate driver may include circuitry (e.g., logic) to generate a reset signal (RST) from the multifunction signal (MFP). Further, the gate driver may include circuitry to generate a desaturation check signal (DSCHK) or current-sense check signal (CSCHK) from the multifunction signal (MFP).

FIG. 2A is a schematic block diagram of a gate driver according to a first possible implementation of the present disclosure. The gate driver includes gate driver circuit 211 coupled to an input pin 210 and configured to receive an input signal (IN). The IN signal can be a digital signal with HIGH/LOW levels corresponding to desired ON/OFF switch states. The IN signal may be input to a first comparator 212 with hysteresis to remove switching noise. The output of the first comparator 212 may be coupled to logic (e.g., AND gate 214). The AND gate 214 is further configured to receive a multifunction signal (MFP) from the output of a second comparator 213 with hysteresis. The second comparator 213 is configured to receive the multifunction signal from an MFP pin 215 of the gate driver 200.

The AND gate 214 is configured to output a HIGH signal when the IN signal and the MFP signal are HIGH and to output a LOW signal otherwise. In other words, the MFP signal may function as an enable signal because the input signal (IN) can pass the AND gate 214 when the MFP signal is HIGH and not pass the AND gate 214 when the MFP signal is LOW. The output of the AND gate 214 is coupled to an amplifier 216 that is configured to convert the low-power input signal (IN) to a high-power output signal (OUT). The output of the amplifier 216 is coupled to an output pin 218 of the gate driver 200, which can be coupled to a controlling terminal of a high-power switching device.

The gate driver 200 is configured to monitor a desaturation signal (DESAT) at a desaturation pin 220. As discussed, the DESAT signal can be a voltage of an externally coupled capacitor (C), which can indicate if the switching device is in a saturation mode. The gate is configured to measure the DESAT signal while the switching device is ON. Accordingly, the gate driver includes a DESAT discharge transistor (i.e., discharge transistor 222) that is coupled between the DESAT pin and a ground (e.g., GND2). A controlling terminal (e.g., gate terminal) of the discharge transistor 222 is coupled to logic (e.g., NOR gate) that is configured to ground the DESAT pin 220 when the switching device is OFF (i.e., the input signal is LOW). As shown, the logic may be implemented as a NOR gate 224 that receives the IN signal while the gate driver is enabled and further receives a desaturation check signal (DSCHK). The DSCHK signal can be LOW in normal conditions and can be HIGH during a test of the desaturation circuitry. In other words, unless the gate driver is (i) disabled or (ii) performing a desaturation test, the state of the discharge transistor corresponds to the input signal. For example, while the IN signal is HIGH (i.e., the switching device is ON), the discharge transistor 222 is OFF, and while the IN signal is LOW (i.e., the switching device is OFF), the discharge transistor 222 is ON.

The discharge transistor 222 may be coupled to the input of a fault detector circuit (i.e., fault detector 230) and its ON/OFF state may enable/disable operation of the fault detector 230. When enabled (i.e., discharge transistor 222 is OFF), the fault detector 230 may be configured to receive the DESAT signal and to output a fault signal (FAULT) when the DESAT signal satisfies a criterion. For example, the fault detector 230 may compare the DESAT signal (i.e., $V_C$) to a threshold ($V_{DESAT\text{-}THR}$) and make the FAULT signal HIGH when the DESAT signal exceeds the threshold, otherwise the FAULT signal is LOW. Accordingly, the fault detector 230 may include a comparator 231 with the DESAT signal ($V_C$) at a non-inverting terminal and a threshold voltage ($V_{DESAT\text{-}THR}$) at an inverting terminal of the comparator 231. The threshold voltage may be generated by a voltage source 232 coupled to the inverting terminal of the comparator 231.

The fault detector 230 may further include a current source ($I_{DESAT}$) that is coupled between an upper rail voltage (e.g., VDD) and the DESAT pin 220. The current source ($I_{DESAT}$) is configured to charge the capacitor (C), which is coupled externally to the DESAT pin 220 during a DESAT test. The capacitor (C) can also be coupled to a collector terminal of an IGBT (not shown) so that the current source will help charge the capacitor (C) to the collector-emitter voltage ($V_{CE}$) of the IGBT when it is ON. When the DESAT test is over and the IGBT is OFF, charge on the capacitor (C) (i.e., voltage ($V_C$)) may be drained (i.e., decreased) by the discharge transistor 222.

The output of the fault detector 230 can be a fault signal (FAULT) that is HIGH when a fault (e.g., high current condition) is detected and is LOW when no fault (e.g., normal current condition) is detected. The fault signal (FAULT) is coupled to a fault communication circuit 245 that includes a latch (e.g., SR latch). The latch 240 can be configured to hold the FAULT signal HIGH until it is reset by a reset signal (RST). The output of the latch 240 can be coupled to a fault-bar pin via an output transistor 251.

When a fault is detected, the FAULT signal may be latched HIGH by the latch 240 to switch an output transistor

251 ON to couple a fault-bar pin 250 to a ground (e.g., GND). When the latch 240 is reset to LOW, the output transistor 251 is switched OFF and the fault-bar pin 250 is pulled up to an upper rail voltage (e.g., VDD1) by a pull-up resistor 252. Accordingly, a fault-bar signal (FLTb) is an inverted version of the fault signal (FAULT) that is held LOW by a latch 240 until it is cleared by a reset signal.

While the gate driver is configured to provide continuous DESAT protection, the disclosed gate driver can also be configured in a test mode to perform a DESAT test. In a DESAT test, the DESAT signal is forced to satisfy the fault criterion. At the same time the FLTb signal can be monitored. If the FLTb signal responds properly to the fault, then the DESAT functionality is verified (i.e., the DESAT test passes). For example, a proper response to the fault, can be the FLTb signal transitioning to a LOW level, where it is held by the latch. If the FLTb signal does not respond properly to the fault (e.g., the FLTb signal does not transition to a latched LOW state), then the DESAT functionality is not verified (i.e., the DESAT test fails).

The gate driver 200 includes activation logic 500 (e.g., DSCHK activation logic) that can interpret the MFP signal in the context of other signals, such as the input signal (IN) and the fault signal (FAULT), to configure the gate driver according to multiple functions. The multiple functions can include (i) disabling the output signal, (ii) starting a DESAT test (e.g., to generate a fault condition), and resetting the fault condition (e.g., to resume normal operation).

The multiple functions may correspond to multiple states (i.e., conditions) of the gate driver. For example, while the output is disabled, the gate driver may be said to be in a disabled condition (i.e., disabled state). While a DESAT test is being performed, the gate driver may be said to be in a test condition (i.e., test state). While a fault is detected, the gate driver may be said to be in a fault condition (i.e., fault state). The gate driver may be in a normal condition (i.e., normal state) when it is not in a disabled state, a test state, and a fault state.

Figure 2B:
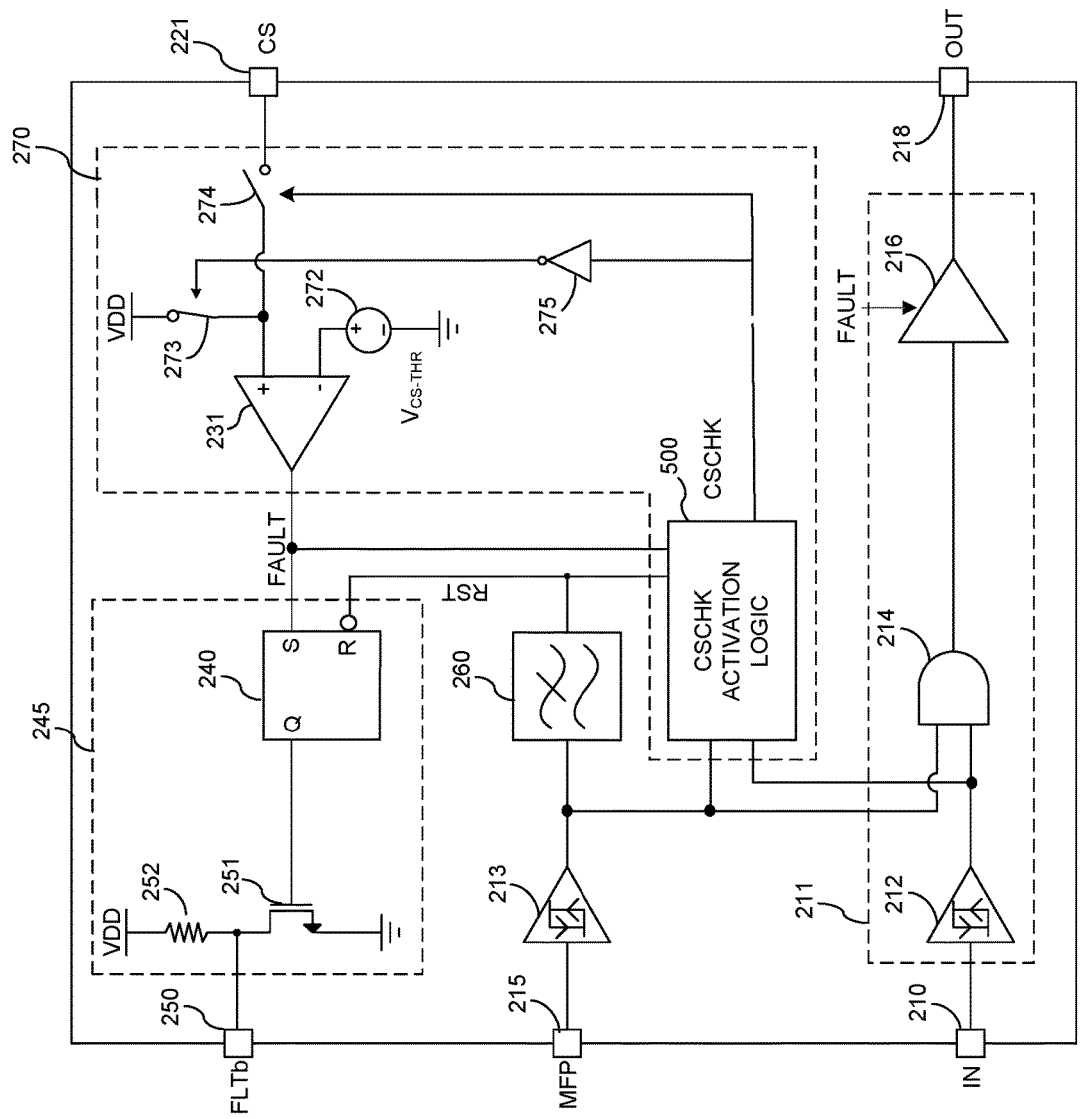
FIG. 2B is a schematic block diagram of a gate driver according to a second possible implementation of the present disclosure.

FIG. 2B is a schematic block diagram of a gate driver according to a second possible implementation of the present disclosure. The gate driver includes a fault communication circuit 245 and a gate driver circuit 211 as in FIG. 2A, but includes a fault detector circuit (i.e., fault detector 270) based on a sensed current signal (CS) rather than a DESAT signal. As before the output of the fault detector 270 can be a fault signal (FAULT) that is high when a fault (e.g., high current condition is detected and LOW when no fault (e.g., normal current condition) is detected. In a normal mode, a current sense pin 221 is coupled by a first switch 274 to a positive input of a comparator 231, while an upper supply voltage (VDD) is decoupled by a second switch 273 from the positive input of the comparator 231. The comparator 231 is configured to compare the voltage (i.e., the CS signal) to a current-sense threshold ($V_{CS-THR}$) coupled to a negative terminal of the comparator. When the CS signal exceeds the current-sense threshold ($V_{CS-THR}$), the fault detector 270 is configured to trigger the fault state in the gate driver.

The gate driver further includes activation logic 500 (i.e., CSCHK activation logic) that is configured to interpret MFP signals in the context of other signals, such as the input signal (IN) and the fault signal (FAULT), to configure the gate driver according to multiple functions. The multiple functions can include (i) disabling the output signal, (ii) starting a CS test (e.g., to generate a fault condition), and resetting the fault condition (e.g., to resume normal operation).

In a CS test the fault logic may configure the first switch 274 to decouple the CS pin 221 from the positive input of the comparator 231 and the second switch 273 to couple the upper rail voltage (VDD) to the positive input of the comparator 231 in order to trigger a fault condition (i.e., FAULT=HIGH). The activation logic 500 is further configured to deactivate the CS test (i.e., reset the fault condition) after the test has concluded by coupling the CS pin to the positive input of the comparator 231 via the first switch 274 and decoupling the upper rail voltage (VDD) from the positive input of the comparator 231 via the second switch 273. An inverter 275 can be included so that the switches may be controlled in complementary fashion.

Figure 3:
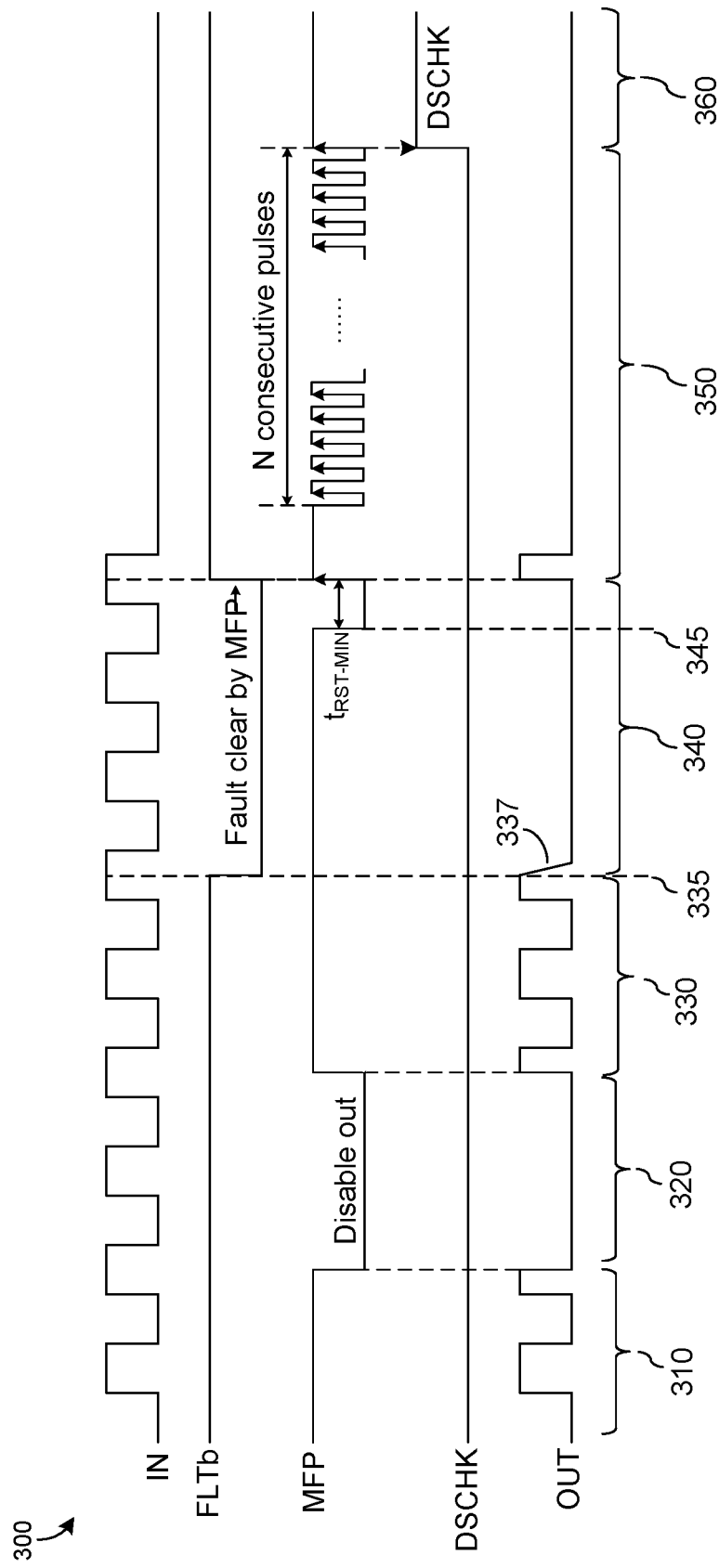
FIG. 3 are graphs of signals illustrating functions controlled by a multifunction signal according to a possible implementation of the present disclosure.

FIG. 3 are graphs of signals illustrating functions controlled by a multifunction signal (MFP) according to a possible implementation of the present disclosure. In the graphs 300, the signals are aligned in time and alternate between HIGH levels and LOW levels to indicate conditions and alter operation of the gate driver. The graphs include a DSCHK signal, but it should be understood that a CSCHK signal could behave similarly.

During a first period 310, the gate driver is in normal operation (i.e., in a normal state). Here, the MFP signal is HIGH to enable the output so that the OUT signal follows (i.e., matches) the IN signal. Further, in normal operation, the FLTb signal is HIGH indicating that no fault (i.e., high current) is detected and the DSCHK signal is LOW indicating that a DESAT test is not underway.

During a second period 320, the output of the gate driver is disabled (i.e., the gate driver is in a disabled state). Here, the MFP signal is LOW to disable the output. When the output is disabled, the OUT signal is LOW despite HIGH levels of IN signal. Here the output was disabled for a reason other than a fault or a DESAT test because during the second period, the FLTb signal is HIGH indicating that no fault condition and the DSCHK signal is LOW indicating that a DESAT test is not underway.

During a third period 330, the normal operation (i.e., the normal state) of the gate driver is restored because the MFP signal is HIGH to enable the output so that the OUT signal again follows (i.e., matches) the IN signal. Further, in normal operation, the FLTb signal is HIGH indicating that no fault (i.e., high current) is detected and the DSCHK signal is LOW indicating that a DESAT test is not underway.

At a first time 335, the FLTb signal transitions LOW indicating that a fault is detected. The LOW FLTb signal disables the output. Accordingly, during a fourth period 340, the gate driver is disabled, and the gate driver is in fault operation (i.e., in a fault state). Here, the output is disabled by the FLTb signal being LOW despite the MFP signal being HIGH. Also note, that the HIGH output signal (OUT) may be turned off slowly when being disabled to prevent voltage spikes (e.g., due to back EMF). In other words, the output may be disabled according to a soft turn off 337 (i.e., STO). The amplifier 216 of the gate driver 200 shown in FIGS. 2A-2B can be configured to reduce the OUT signal according to a soft turn off (i.e., soft shutdown) profile.

At a second time 345, the MFP signal is transitioned LOW so that both the FLTb and the MFP signal are LOW. If this condition is held for more than a minimum reset period ($T_{RST\_mIN}$) then the FLTb signal is reset to a HIGH level indicating no fault condition. Additionally, the MFP signal can be reset to a HIGH level to enable the output so that a normal condition is restored during a fifth period 350.

During the fifth period 350 the input signal (IN) may be turned off and the MFP signal may be pulsed (i.e., toggled) for a number of consecutive pulses to begin a DESAT test.

During a sixth period 360 the gate driver is in a DESAT test operation (i.e., DESAT test state) a DSCHK signal is transition HIGH to disable the discharge transistor 222 so that the external capacitor (C) can be charged for the test.

Figure 4:
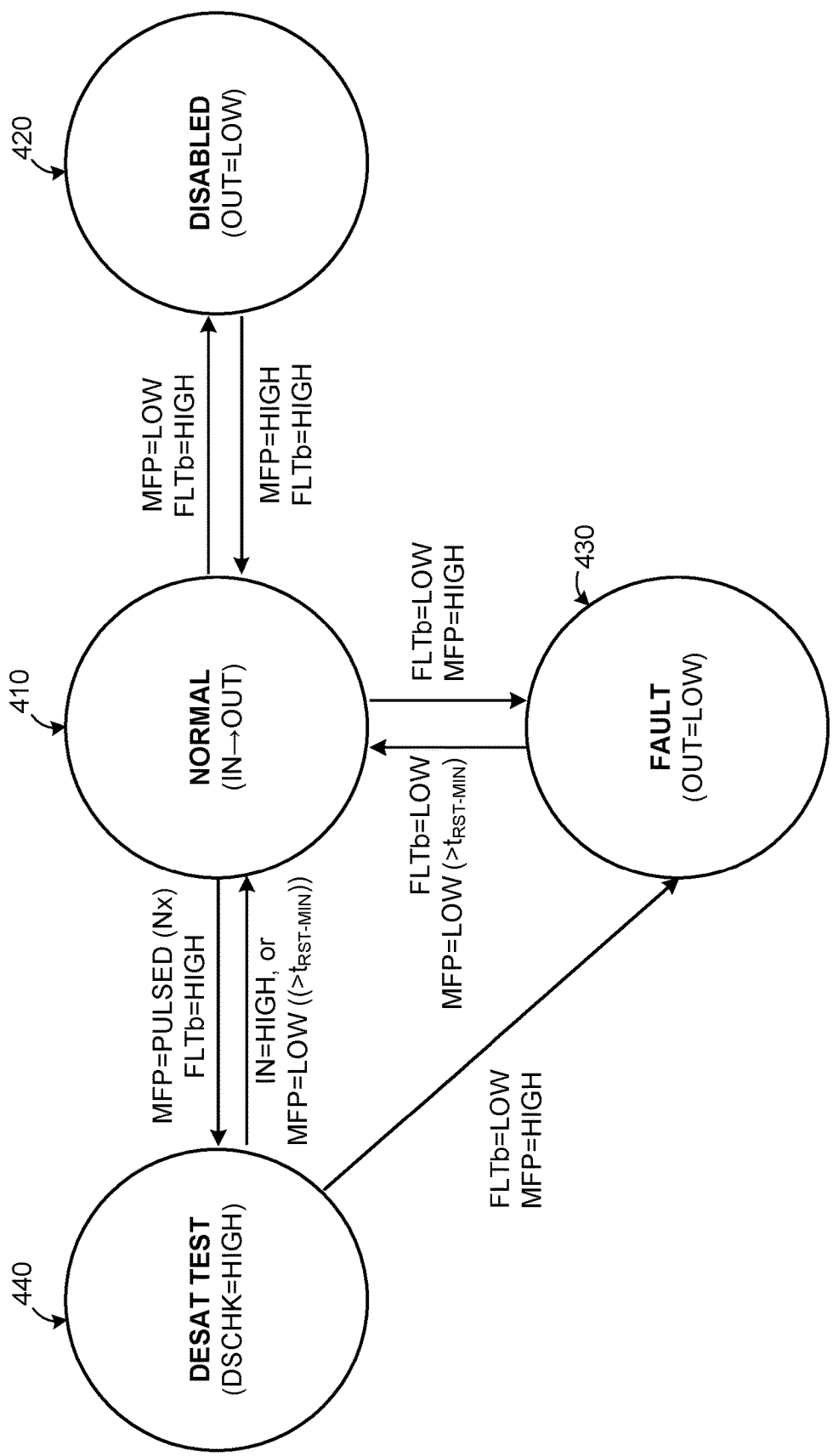
FIG. 4 illustrates a state diagram that summarizes the states of the gate driver and the transitions between states.

FIG. 4 illustrates a state diagram that summarizes the states and the transitions between states, such as described with the signals of FIG. 3. The gate driver can operate in a normal state 410 (i.e., normal mode) in which the output signal follows the input signal. The normal state 410 may be the most common operating state of the gate driver. Operation in states other than the normal state may be temporary and may ultimately result in a return to the normal state.

The gate driver can also operate in a disabled state 420 (i.e., disabled mode) in which the output is held LOW. The gate driver may transition from the normal state 410 to the disabled state 420 and from the disabled state 420 to the normal state 410 according to a level of the MFP signal. The gate driver can operate in a disabled state even when there is no fault detected.

The gate driver can also operate in a fault state 430 (i.e., fault mode) in which the output is held LOW. The gate driver may transition from the normal state 410 to the fault state 430 according to a level of the FTLb signal. In the fault mode, the FLTb signal is latched at a LOW level. The gate driver may transition from the fault state 430 to the normal state 410 when the MFP signal is held LOW for a period greater than or equal to a threshold ($T_{RST\text{-}MIN}$).

The gate driver can also operate in a DESAT test state 440 (i.e., DESAT test mode, DSCHK mode) in which the DSCHK signal is held HIGH. The gate driver may transition from the normal state 410 to the DESAT test state 440 after the MFP signal is pulsed (e.g., HIGH/LOW/HIGH) for a number of times (e.g., 15 times). In the DESAT test state 440, the voltage at the DESAT pin can be charged until it exceeds a threshold ($V_{DESAT\text{-}THR}$), thereby changing the FLTb level. The gate driver may transition from the DESAT test state 440 to the fault state 430 according to the FLTb level. As before, the gate driver may transition from the fault state 430 to the normal state 410 when the MFP signal is held LOW for a period greater than or equal to a threshold ($T_{RST\text{-}MIN}$).

Figure 5:
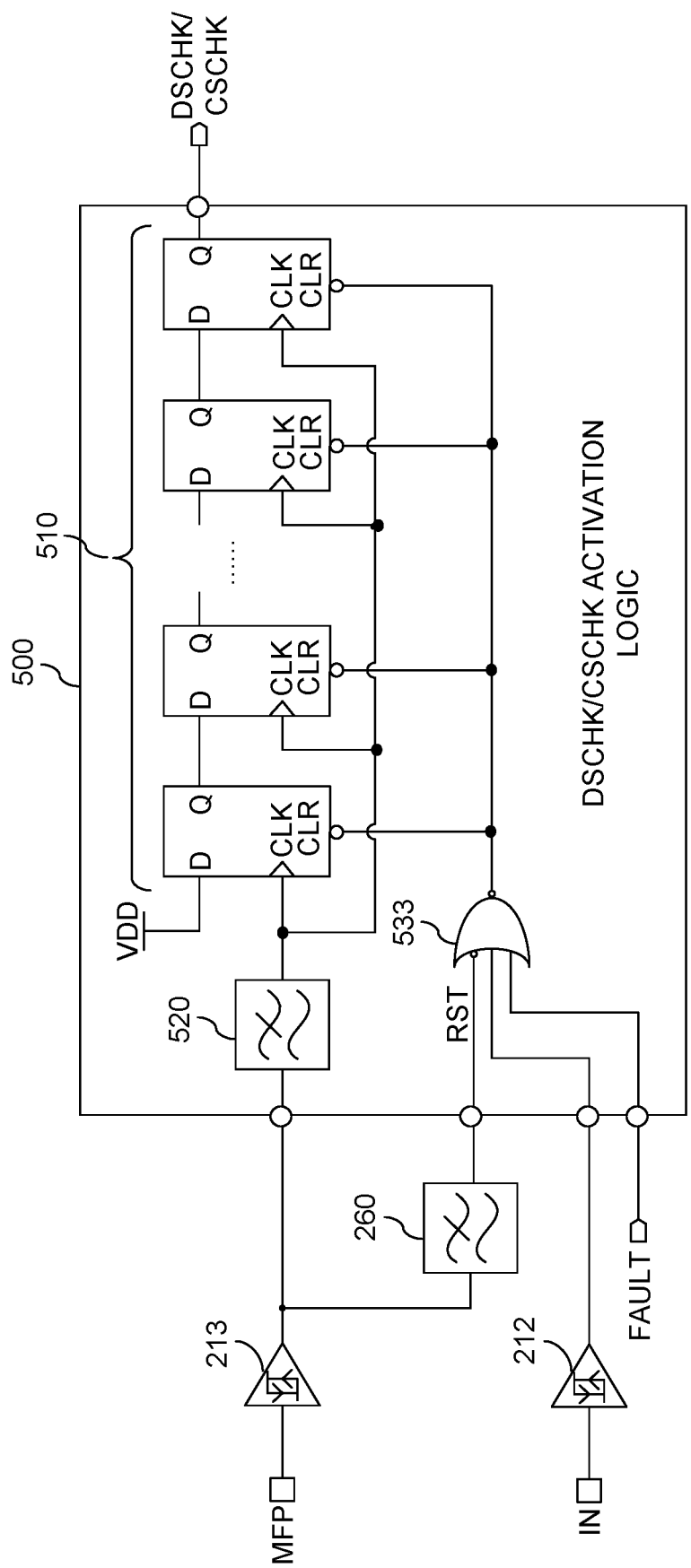
FIG. 5 is a schematic block diagram of a desaturation check (DSCHK) activation logic according to a possible implementation of the present disclosure.

As shown in FIGS. 2A and 2B, the gate driver 200 further includes activation logic 500 to generate the DSCHK signal or CSCHK signal (i.e., DSCHK/CSCHK signal). FIG. 5 is a schematic block diagram of an activation logic circuit according to a possible implementation of the present disclosure. The activation logic 500 is configured to control a level of a desaturation check signal (DSCHK) or a current sense check signal (CSCHK). In particular the activation logic is configured to make the DSCHK/CSCHK signal HIGH when the MFP signal is pulsed (i.e., toggled) for a number of cycles. A HIGH DSCHK/CSCHK signal can configure the gate driver in a DESAT test state to charge the external capacitor (C) or a CS test state to couple the upper rail voltage to the input of the comparator.

The activation logic 500 includes a shift register 510. The input of the shift register 510 can be coupled to a HIGH signal (i.e., VDD) and the output of the shift register is the DSCHK/CSCHK signal. The shift register includes a plurality of flip-flops (e.g., D-type flip-flops) coupled in series. The MFP signal may be coupled to a clock input of each of the flip flops so as the MFP signal is pulsed, the HIGH signal shifts to the output of the shift register. For example, if four flip flops are implemented then the MFP signal can be pulsed four times for the HIGH signal (VDD) to reach the output. The activation logic may include a low pass filter 520 coupled between the MFP signal and the shift register 510.

The low pass filter 520 may remove spurious signals from the MFP signal that could cause shift errors in the shift register 510.

The DSCHK/CSCHK signal may be deactivated (i.e., made LOW) by clearing the shift register 510. The shift registered may be cleared in several conditions. Accordingly, the activation logic includes a logic gate (e.g., NOR gate 533) configured to clear the flip-flops of the shift register.

The NOR gate 533 is configured to receive a reset signal (RST), the input signal (IN), and the fault signal (FAULT). The NOR gate is configured to clear the shift register 510 if the RST signal is LOW, the IN signal is HIGH, or the FAULT signal is HIGH.

As mentioned previously, the DSHK signal may be deactivated (i.e., the DESAT test ended) by holding the MFP signal LOW for a period that is greater than a threshold (e.g., $T_{RST\text{-}MIN}$). The gate driver 200 includes a low pass filter 260 that is configured to receive the MFP signal and output the RST signal. A delay associated with the low pass filter 260 may help to create the threshold ($T_{RST\text{-}MIN}$) that is satisfied for the RST to change states and clear the shift register 510.

Figure 6:
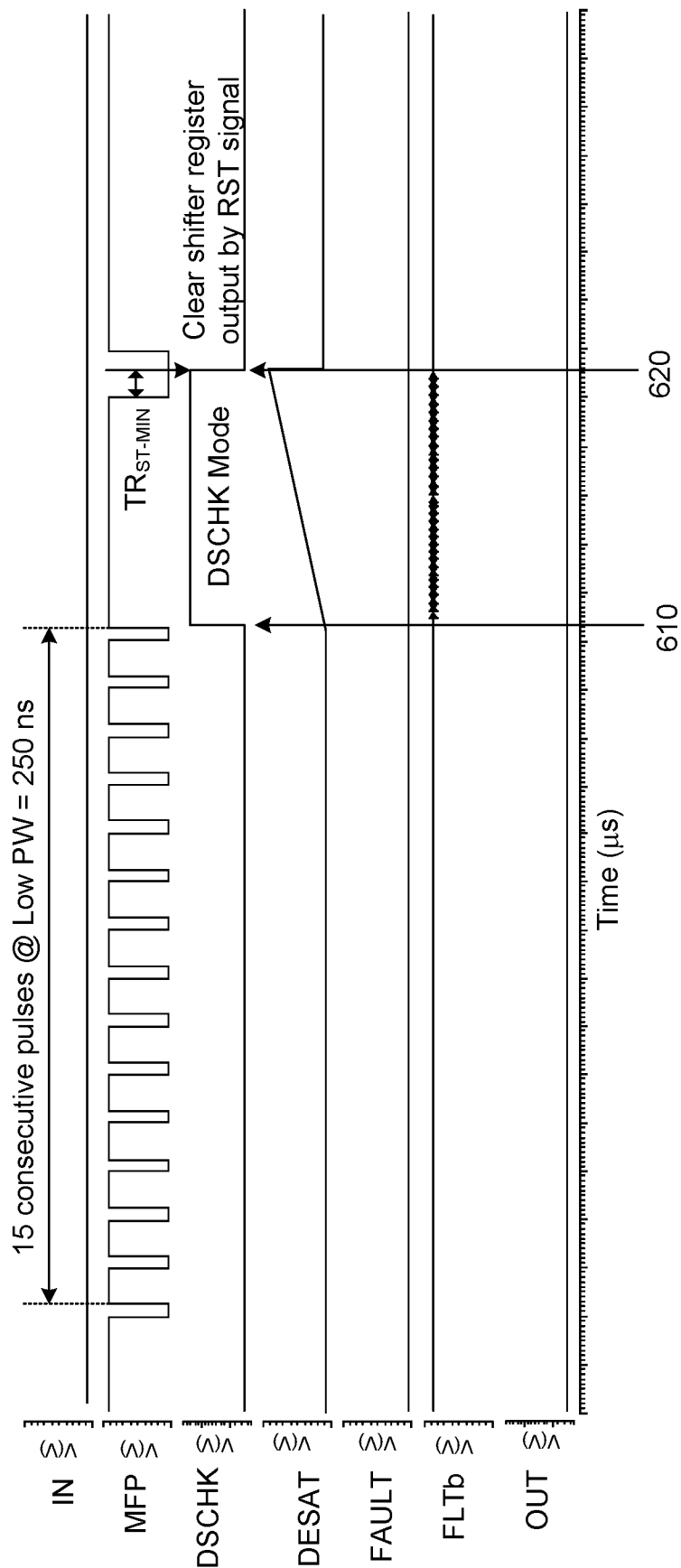
FIG. 6 are graphs of signals illustrating terminating a DESAT test according to a possible implementation of the present disclosure.

FIG. 6 illustrates terminating a DSCHK mode (i.e., DESAT test state) by holding the MFP signal low for a period ($T_{RST\text{-}MIN}$). While shown for the DSCHK mode, it may be understood that a CSCHK mode could operate similarly. At a first time 610, the DSCHK signal is transitioned HIGH as a result of the MFP signal pulsing for a number of pulses determined by the shift register (e.g., 15 pulses). The gate driver enters the DSCHK mode, and the external capacitor is charged, thereby raising the DESAT signal. If the DESAT signal is allowed to rise above a threshold (e.g., $V_{DESAT\text{-}THR}$), then the FAULT signal will transition HIGH moving the gated driver out of the DSCHK mode and into the FAULT mode. Here, however, the MFP signal is held low for a period ($T_{RST\text{-}MIN}$) before a fault occurs. Accordingly at a second time 620, the shift register is cleared so that the DSCHK signal is transitioned LOW and the gate driver returns to the NORMAL state. In the NORMAL state, the charge on the capacitor (i.e., DESAT signal) is drained by the discharge transistor 222 when the IN signal is low, as is the case shown here.

Figure 7:
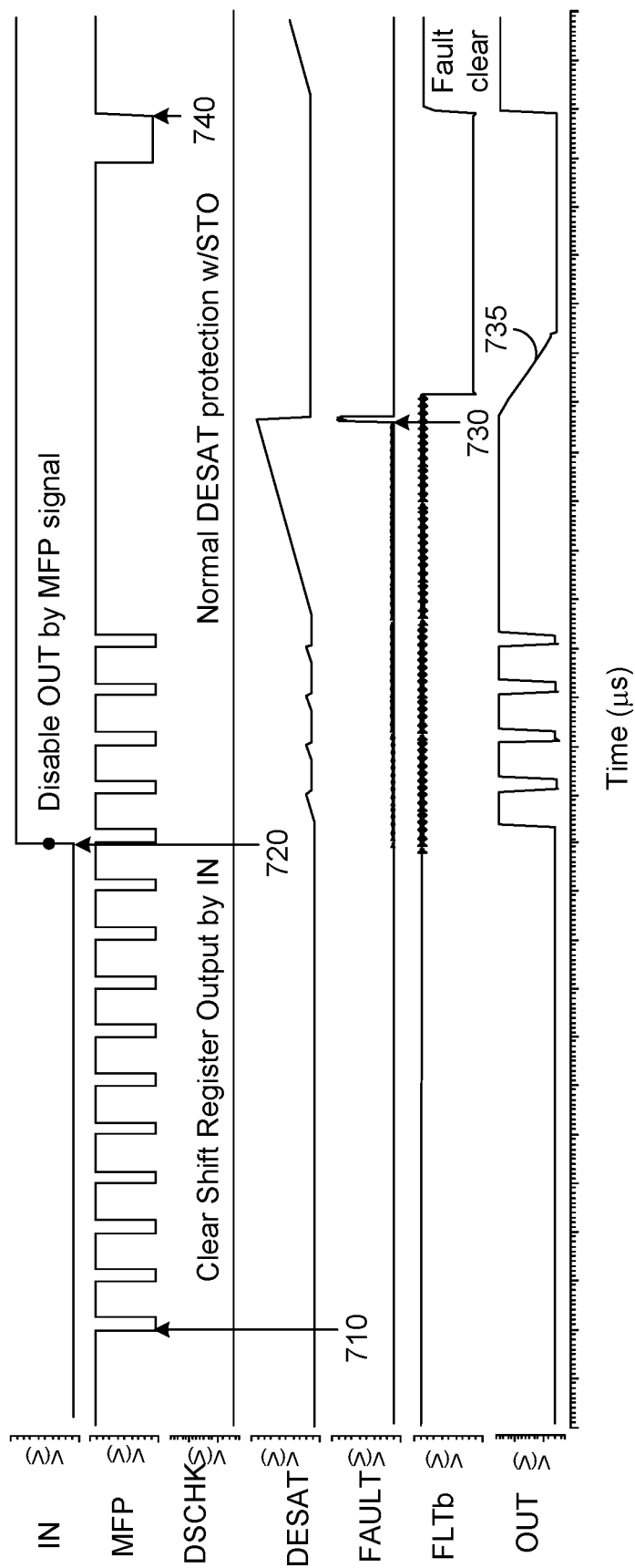
FIG. 7 are graphs of signals illustrating preventing a DESAT test and responding to a fault according to a possible implementation of the present disclosure.

FIG. 7 illustrates a DSCHK mode (i.e., DESAT test state) that is prevented when the IN signal is HIGH. While shown for the DSCHK mode, it may be understood that a CSCHK mode could operate similarly. At a first time 710, the MFP signal is toggled to begin a DESAT test (i.e., make DSCHK HIGH). At a second 720, however, the IN signal is transition HIGH. This clears the shift register and as a result DSCHK is held LOW. In other words, the HIGH IN signal prevents the gate driver from entering the DESAT test state and remains in NORMAL mode. In normal mode the OUT signal follows the IN signal but is disabled when the MFP signal is pulsed LOW. When the OUT signal is held HIGH by the IN signal the DESAT signal charges and eventually at a third time 730, a fault condition is reached, making the FAULT signal HIGH. In other words, at the third time 730 the gate driver enters the FAULT state. Here, the output is shut down (e.g., according to a soft turn off (STO) profile 735. For example, the FAULT signal may trigger the amplifier 216 to perform a soft shutdown (SSD) of its output (see FIG. 2). The gate driver remains in the fault state (i.e., FLTb is LOW) until it is returned to a NORMAL state at a fourth time 740 by holding the MFP signal LOW for a period.

Figure 8:
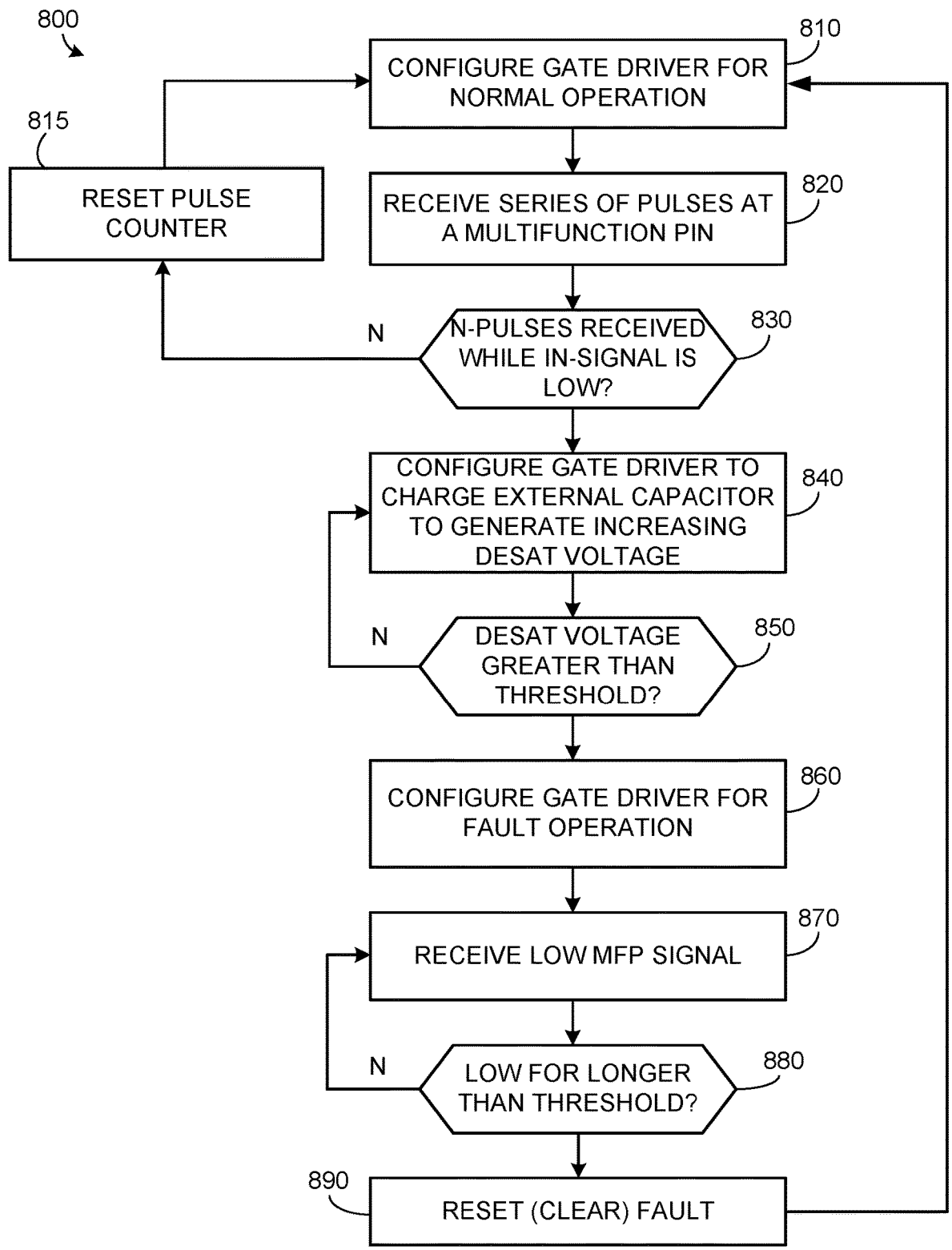
FIG. 8 is a method for controlling a gate driver to perform a test of its fault sensing capabilities according to a possible implementation of the present disclosure.

FIG. 8 is a method for controlling a gate driver to test its faut detector circuit. The method 800 includes configuring 810 the gate driver for normal operation (i.e., OUT signal at OUT pin follows IN signal at IN pin). The method 800 further includes receiving 820 a series of pulses at a multifunction pin of the gate driver. The gate driver can receive the pulses until a first criterion 830 is satisfied. The first criterion may be receiving a number of consecutive pulses while the IN signal is LOW. If the first criterion is not satisfied, then the gate driver may be configured to reset 815 a pulse counter (e.g., shift register) and return to normal operation 810. When the first criterion is satisfied, however, the method 800 further includes configuring 840 the gate driver to charge an external capacitor, which generates an increasing DESAT voltage. The DESAT voltage can continue to increase until it satisfies a second criterion 850. The second criterion 850 may be the DESAT voltage exceeding a threshold. When the second criterion is satisfied, the method 800 further includes configuring 860 the gate driver for fault operation (i.e., FAULT state). In fault operation, the gate driver may be configured to discharge the external capacitor and transmit a fault signal (FLTb) to a fault pin of the gate driver. The fault operation can continue until an MFP signal is received 870 that satisfies a third criterion 880. The third criterion 880 can be that the MFP signal at the multifunction pin is held LOW for a period longer than a threshold time. When the third criterion 880 is satisfied, the method 800 includes clearing 890 the fault and returning the gate driver to normal operation 810 (i.e., NORMAL state).

Figure 9:
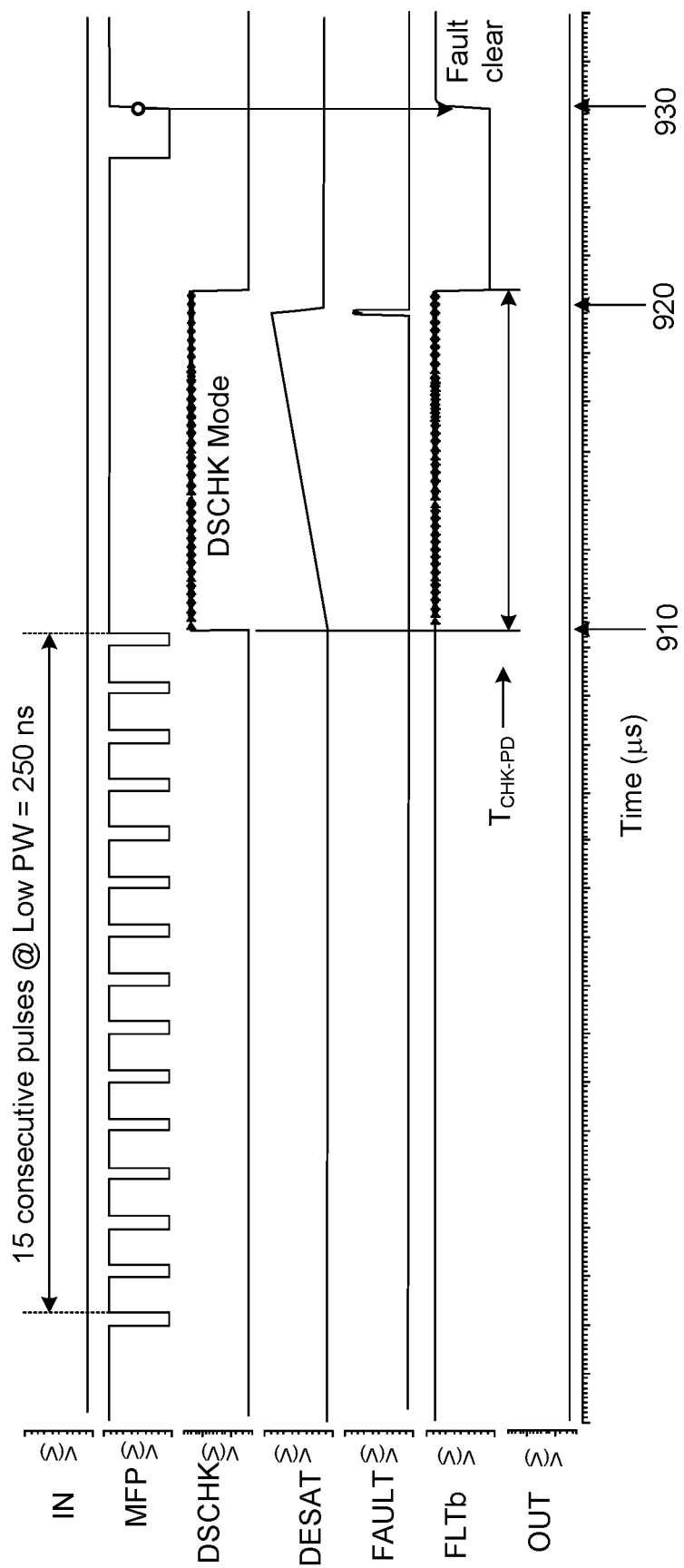
FIG. 9 are graphs of signals illustrating a gate driver performing a test of its fault sensing capabilities according to a possible implementation of the present disclosure.

FIG. 9 illustrates signals of the gate driver during a test of its fault sensing capabilities, such as described for the method illustrated in FIG. 8. While shown for the DSCHK mode, it may be understood that a CSCHK mode could operate similarly. At a first time 910, a series of 15 consecutive pulses in the MFP signal is received at the gate driver while the IN signal is LOW, thus satisfying the first criterion of the method described above. Accordingly, the gate driver is configured to charge an external capacitor, which increases a DESAT signal. At a second time 920, the DESAT signal exceeds a threshold, thus satisfying the second criterion of the method described above. Accordingly, the gate driver is configured to generate a fault (FAULT) which clears the DESAT signal and latches a fault signal (FLTb) at a fault pin of the gate driver LOW. At a third time 930, the MFP signal is held LOW for a period, thus satisfying the third criterion of the method described above. Accordingly, the gate driver is configured to reset the fault signal (FLTb), which ends the test.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

The invention claimed is:

1. A high-power switching system comprising:
a switching device;
a gate driver having an input pin, a fault pin, and a multifunction pin for a multifunctional signal; and
a controller configured to:
transmit an input signal to the input pin of the gate driver to control operation of the switching device,
receive a fault signal from the fault pin of the gate driver to monitor a fault in the switching device, and
transmit a multifunction signal to the multifunction pin of the gate driver to control operation of the gate driver; wherein the gate driver is configured by the multifunction signal to:
disable an output pin of the gate driver when the multifunction signal is in a first binary state;
activate a fault test to test a fault detector circuit of the gate driver when the multifunction signal is pulsed between the first binary state and a second binary state for a number of consecutive pulses; and
clear the fault signal of the fault detected by the fault detector circuit of the gate driver when the multifunction signal is held in the first binary state for a period greater than a threshold to clear the fault signal.

2. The high-power switching system according to claim 1, wherein the fault is a short circuit in the switching device or an over-current in the switching device.

3. The high-power switching system according to claim 1, wherein the fault test is a desaturation (DESAT) test or a CS test.

4. The high-power switching system according to claim 1, wherein the switching device is an IGBT.

5. The high-power switching system according to claim 1, wherein the switching device is a power MOSFET.

6. The high-power switching system according to claim 1, wherein the fault test configures the gate driver to generate the fault signal at a level corresponding to the fault, the level corresponding to the fault held until cleared by the multifunction signal.

7. The high-power switching system according to claim 1, wherein the first binary state is LOW and wherein when the multifunction signal is made LOW, the gate driver is configured in a disabled state that includes the output pin being LOW and the fault pin indicating no fault.

8. The high-power switching system according to claim 1, wherein when the multifunction signal is pulsed between the first binary state and the second binary state for the number of consecutive pulses, the gate driver is configured in a desaturation (DESAT) test state that includes holding a desaturation-check (DSCHK) signal HIGH to enable circuitry to generate a DESAT signal to cause the fault.

9. The high-power switching system according to claim 1, wherein the gate driver includes isolation to separate a low-power side from a high-power side.

10. The high-power switching system according to claim 1 wherein the gate driver includes:
a driver circuit configured to receive the input signal at the input pin of the gate driver and to transmit an output signal to the switching device coupled at a gate terminal to the output pin of the gate driver; and
a fault communication circuit coupled to the fault detector circuit and configured to set the fault signal when the fault is detected and transmit the fault signal to the fault pin of the gate driver.

11. The high-power switching system according to claim 10, wherein the driver circuit is configured to transmit a LOW output signal when the multifunction signal is LOW.

12. The high-power switching system according to claim 11, wherein the driver circuit is configured to transmit the output signal as a replica of the input signal when the multifunction signal is HIGH.

13. The high-power switching system according to claim 10, wherein the fault communication circuit includes a latch that is set to a fault level by the fault detector circuit in response to the fault.

14. The high-power switching system according to claim 13, wherein the latch is reset to a normal level when the multifunction signal is held LOW for the period greater than the threshold.

15. The high-power switching system according to claim 10, wherein the fault detector circuit includes:
a shift register coupled to the multifunction pin, the shift register outputting a DSCHK signal to activate the fault test of the fault detector circuit after receiving a number of consecutive pulses in the multifunction signal.

16. The high-power switching system according to claim 10, wherein the fault detector circuit configured to receive a desaturation signal at a desaturation (DESAT) pin of the gate driver, the fault detector circuit including:
a capacitor that is coupled externally to the gate driver at the DESAT pin;
a discharge transistor configured to discharge the capacitor to ground when turned ON; and
a current source configured to charge the capacitor when the discharge transistor is turned OFF, a voltage on the capacitor being the desaturation signal at the DESAT pin.

17. The high-power switching system according to claim 16, wherein the fault test of the fault detector circuit includes configuring the fault detector circuit to:
charge the capacitor to increase the voltage at the DESAT pin;
compare the voltage at the DESAT pin to a threshold; and
detect the fault when the voltage exceeds the threshold.

18. A high-power switching system comprising:
a controller;
a switching device; and
a gate driver including:
a driver circuit configured to receive an input signal at an input pin of the gate driver and to transmit an output signal to a switching device coupled at a gate terminal to an output pin of the gate driver;
a fault detector circuit configured to receive a desaturation signal at a desaturation (DESAT) pin of the gate driver to detect a fault in the switching device;
a fault communication circuit coupled to the fault detector circuit and configured to set a fault signal when a fault is detected and transmit the fault signal to a fault pin of the gate driver; and
a multifunction pin configured to receive a multifunction signal, the gate driver configured by the multifunction signal to:
enable the driver circuit when the multifunction signal is in a first binary state or disable the driver circuit when the multifunction signal is in a second binary state;
activate a test of the fault detector circuit when the multifunction signal is pulsed between the first binary state and the second binary state for a number of consecutive pulses; and
reset the fault communication circuit when the multifunction signal is held in the second binary state for a period greater than a threshold.

* * * * *